(12) United States Patent
Uehara et al.

(10) Patent No.: US 7,538,031 B2
(45) Date of Patent: May 26, 2009

(54) METHOD OF MANUFACTURING A WIRING SUBSTRATE AND AN ELECTRONIC INSTRUMENT

(75) Inventors: Noboru Uehara, Okaya (JP); Tsuyoshi Shintate, Matsuyama (JP); Kazuaki Sakurada, Suwa (JP)

(73) Assignee: Seiko Epson Corporation (JP)

( * ) Notice: Subject to any disclaimer, the term of this patent is extended or adjusted under 35 U.S.C. 154(b) by 499 days.

(21) Appl. No.: 11/235,645

(22) Filed: Sep. 26, 2005

(65) Prior Publication Data

US 2006/0068525 A1 Mar. 30, 2006

(30) Foreign Application Priority Data

Sep. 28, 2004 (JP) .............................. 2004-282221

(51) Int. Cl.
*H01L 21/44* (2006.01)

(52) U.S. Cl. .................... 438/660; 438/676; 438/686

(58) Field of Classification Search ............... 438/660, 438/676, 686
See application file for complete search history.

(56) References Cited

U.S. PATENT DOCUMENTS

| | | | |
|---|---|---|---|
| 5,132,248 A | 7/1992 | Drummond et al. | |
| 6,994,414 B2 | 2/2006 | Hashimoto | |
| 7,285,305 B2 * | 10/2007 | Furusawa et al. | ............ 427/117 |
| 2003/0203643 A1 | 10/2003 | Hasei | |
| 2004/0000429 A1 | 1/2004 | Furusawa | |

FOREIGN PATENT DOCUMENTS

| | | |
|---|---|---|
| JP | 11-163499 | 6/1999 |
| JP | 2003-133691 | 5/2003 |
| JP | 2003-309369 | 10/2003 |
| JP | 2003-337552 | 11/2003 |

* cited by examiner

*Primary Examiner*—Jack Chen
(74) *Attorney, Agent, or Firm*—Harness, Dickey & Pierce, P.L.C.

(57) ABSTRACT

A method of manufacturing a wiring substrate having a wiring layer formation step that includes: a first surface processing step in which surface processing is performed on a film formation area of a substrate; a wiring formation step in which a wiring pattern is formed by placing a first liquid material on the film formation area; a second surface processing step in which surface processing is once again performed on the film formation area; and an insulating film formation step in which an insulating film is formed by placing a second liquid material in gaps in the wiring pattern, wherein an affinity between the second liquid material and the film formation area in the insulating film formation step is greater than an affinity between the first liquid material and the film formation area in the wiring formation step.

16 Claims, 7 Drawing Sheets

METHOD OF MANUFACTURING A WIRING SUBSTRATE AND AN ELECTRONIC INSTRUMENT

BACKGROUND OF THE INVENTION

1. Field of the Invention

The present invention relates to a method of manufacturing a wiring substrate and to an electronic instrument.

Priority is claimed on Japanese Patent Application No. 2004-282221, filed Sep. 28, 2004, the contents of which are incorporated herein by reference.

2. Description of Related Art

A photolithographic process, for example, is used to form a wiring pattern that forms an electronic instrument. However, not only are large-scale equipment such as a vacuum apparatus and complicated processing necessary in a photolithographic process, but the utilization efficiency of the material is only a low percentage and most of the material ends up being wasted. Consequently, manufacturing costs are high. Furthermore, there is a limit as to how finely detailed the wiring pattern can be made.

Therefore, instead of a photolithographic process, a process is being investigated in which a wiring pattern is directly rendered by ejecting a liquid that contains a functional material onto a base material (i.e., a droplet ejection process). In this process, firstly, liquid lines are formed by ejecting a liquid in which fine conductive particles have been dispersed onto a substrate from an ejecting head. Next, the liquid lines are baked by performing heat processing or laser irradiation so that a wiring pattern is formed (see, for example, U.S. Pat. No. 5,132,248). According to this type of droplet ejection process, because the manufacturing process is simplified and the material utilization efficiency is high, the manufacturing costs can be reduced. Moreover, more finely detailed wiring patterns can also be made.

In recent years, the density level of circuits forming electronic instruments has consistently become higher and there have been demands for further miniaturization and narrower wires in the wiring patterns that make up the circuit. However, if this type of detailed wiring pattern is formed using a method that employs the aforementioned droplet ejection process, after the ejected droplets have landed on a substrate they tend to spread out. As a result, in order to form a detailed wiring pattern accurately and consistently, suitable surface control is necessary.

SUMMARY OF THE INVENTION

It is an object of the present invention to provide a method that solves the above described problems and forms a detailed wiring pattern accurately and consistently.

In order to solve the above described problems, the present invention is a method of manufacturing a wiring substrate having a wiring layer formation step that includes: a first surface processing step in which surface processing is performed on a film formation area of a substrate; a wiring formation step in which a wiring pattern is formed by placing a first liquid material on the film formation area; a second surface processing step in which surface processing is once again performed on the film formation area; and an insulating film formation step in which an insulating film is formed by placing a second liquid material in gaps in the wiring pattern, wherein affinity between the second liquid material and the film formation area in the insulating film formation step is greater than affinity between the first liquid material and the film formation area in the wiring formation step.

According to this manufacturing method, in a wiring formation step to form a finely detailed pattern, it is possible to form such a finely detailed wiring pattern accurately by suppressing the excessive spreading of moisture while securing adhesion of a liquid material to a film forming surface. On the other hand, in an insulating film formation step to form a substantially solid film, it is possible to prevent the liquid material from being repelled by the film formation surface and to form an insulating film having a uniform film thickness. Accordingly to the present manufacturing method, it is possible to obtain a wiring substrate in which a finely detailed wiring pattern, which contributes to an improvement in the degree of integration, and an insulating film that has excellent electrical reliability are formed on a base member.

In the method of manufacturing a wiring substrate of the present invention, it is possible for a common surface processing apparatus to be used in the first surface processing step and the second surface processing step, and for the affinity of the film formation area towards the liquid material to be adjusted by making the processing time in the second surface processing step longer than the processing time in the first surface processing step.

Alternatively, in the method of manufacturing a wiring substrate of the present invention, it is possible for a common surface processing apparatus to be used in the first surface processing step and the second surface processing step, and for the affinity of the film formation area towards the liquid material to be adjusted by making the processing speed in the second surface processing step faster than the processing speed in the first surface processing step.

Note that, control of the surface condition by the above surface processing apparatus can be achieved, for example, by measuring and adjusting the contact angle relative to predetermined liquid materials.

In the method of manufacturing a wiring substrate of the present invention, it is preferable that the surface processing apparatus is an ultraviolet irradiation apparatus that irradiates ultraviolet light onto the substrate. Because it is possible, if surface processing is performed by light irradiation, to achieve uniform imparting liquid affinity of the processed surface or to prevent contamination of the processed surface, such an apparatus is preferable as the processing apparatus.

In the method of manufacturing a wiring substrate of the present invention, it is preferable that, prior to the first surface processing step, there is provided a base formation step in which a base insulating film is formed on the film formation area of the substrate.

According to this manufacturing method, it is possible to form a wiring pattern and an insulating film on a uniform film forming surface irrespective of the type of the base material and the surface condition thereof, and control of the surface condition by this surface processing can be easily and accurately accomplished.

In the method of manufacturing a wiring substrate of the present invention, it is preferable that the base formation step includes: a step in which a liquid material that includes a material used to form the base insulating film is coated on the substrate; and a step in which the base insulating film is formed by curing the liquid material that has been coated on the substrate. According to this manufacturing method, in addition to the wiring pattern and insulating film that are formed on the base material, the base insulating film also can be formed using a liquid phase method. This enables the efficiency of the process to be improved, and enables the wiring substrate to be manufactured at a low cost. In particular, if a droplet ejection process is used, a base insulating film can be formed in a predetermined position on a base material using the required amount of liquid material. As a result, this manufacturing method enables the material utilization efficiency to be improved and enables a contribution to be made to a further lowering of costs.

In the method of manufacturing a wiring substrate of the present invention, it is preferable that the liquid material that is placed on the substrate in the base formation step and the liquid material that is placed on the substrate in the insulating film formation step are the same liquid material. According to this manufacturing method, by using the same material, a lowering of costs is achieved. In addition, an excellent close adhesion is obtained between the base insulating film and the insulating film on the upper side thereof.

In the method of manufacturing a wiring substrate of the present invention, it is preferable that the wiring pattern is silver wiring. By using silver as the material for forming a wiring pattern, a detailed pattern can be formed accurately, and a wiring pattern having low resistance can be formed.

In the method of manufacturing a wiring substrate of the present invention, it is preferable that there is included an interlayer insulating film formation step in which an interlayer insulating film is formed that covers the wiring pattern and the insulating film, and a multilayer wiring structure is formed on the substrate by repeatedly performing the wiring layer formation step and the interlayer insulating film formation step. According to this manufacturing method, multiple layers of wiring patterns having excellent electrical reliability can be formed, and a wiring substrate having high density integration can be manufactured. This greatly contributes to reductions in both the size and thickness of electronic instruments that use this wiring substrate.

In the method of manufacturing a wiring substrate of the present invention, it is preferable that the interlayer insulating film formation step is a step in which an interlayer insulating film is formed by placing a third liquid material on the surface area of the substrate including the wiring pattern and the insulating film, and there is provided a third liquid affinity imparting step in which liquid affinity imparting process is performed on the surface area of the substrate including the wiring pattern and the insulating film between the wiring layer formation step and the interlayer insulating film formation step, and affinity between the surface area and the third liquid material in the interlayer insulating film formation step is equal to affinity between the second liquid material and the film formation area in the insulating film formation step.

Because an interlayer insulating film that is used to form a multilayer wiring structure is formed having a solidly printed outline that covers the wiring pattern and the insulating film, it is preferable that the surface condition is controlled such that liquid material that is used to form the interlayer insulating film flows easily over the wiring pattern and the insulating film. Therefore, in the second surface processing step, it is desirable that the same affinity as the affinity towards the liquid material that was imparted to the film formation area is also imparted to the processed surface where the interlayer insulating film is formed.

In the method of manufacturing a wiring substrate of the present invention, it is preferable that in the insulating film formation step, the insulating film is formed so as to cover the wiring pattern, and a multilayer wiring structure can be formed on the substrate by repeatedly performing the wiring layer formation step with the surface of the insulating film taken as the film formation area. In this case, it is possible to obtain a wiring substrate that is constructed such that the insulating film that is formed in the insulating film formation step also functions as an interlayer insulating film.

In the method of manufacturing a wiring substrate of the present invention, it is preferable that the wiring layer formation step includes a conductive post formation step in which conductive posts are formed by ejecting liquid material onto a surface of the wiring pattern. Namely, the manufacturing method of the present invention can also be applied to a structure in which wiring patterns that are stacked via interlayer insulating films or the like are electrically connected by the above described conductive posts. If this type of manufacturing method is employed, then it is also possible to form an interlayer conduction connected structure using a liquid phase method, and a more highly integrated wiring substrate can be manufactured at low cost.

In the method of manufacturing a wiring substrate of the present invention, it is preferable that, in the wiring formation step that includes the conductive post formation step, in the wiring formation step, a temporary dried body is formed by temporarily drying the first liquid material that has been placed on the film formation area, and in the conductive post formation step, after liquid posts have been formed by placing the third liquid material on the temporary dried body, the temporary dried body and the liquid posts are heated so as to form the wiring pattern and the conductive posts. If this type of manufacturing method is employed, then the wiring pattern and the conductive posts can be formed as a single body, and cracks can be effectively prevented from occurring at boundary faces between them. As a result, wiring substrates having a multilayer wiring structure that has excellent electrical reliability can be manufactured in high yields.

The electronic instrument of the present invention is equipped with a wiring substrate obtained using the manufacturing method according to the above described present invention. By employing this type of structure, electrical connections are achieved using wiring substrates that have excellent electrical reliability, and an electronic instrument is provided that has excellent reliability.

BRIEF DESCRIPTION THE DRAWINGS

FIG. 2A is an exploded perspective view of a droplet ejection head, while

DETAILED DESCRIPTION OF THE INVENTION

An embodiment of the present invention will now be described with reference made to the drawings. Note that in each of the drawings used in the description below the scale of each member is suitably altered in order to make each member a recognizable size.

(Droplet Ejection Apparatus)

Figure 1:
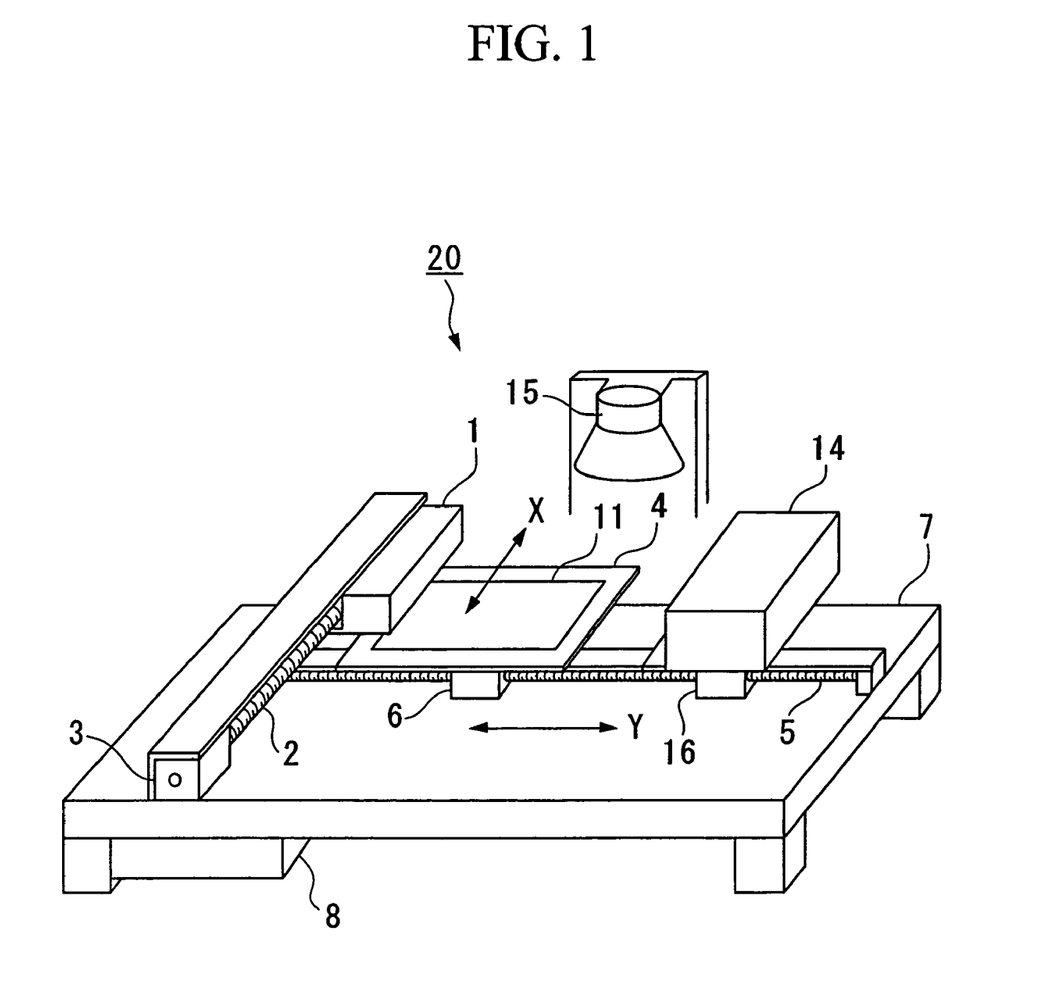
FIG. 1 is a perspective view showing the structure of a droplet ejection apparatus.

Firstly, a description will be given of the droplet ejection apparatus used in an embodiment of a method of manufacturing a wiring substrate. FIG. 1 is a perspective view showing the structure of an example of a droplet ejection apparatus. The droplet ejection apparatus 20 shown in FIG. 1 ejects a liquid material that contains a functional material in droplet form so as to position it on a substrate (i.e., a base material) 11. The droplet ejection apparatus 20 is provided with a carriage 1 that is equipped with one or a plurality of ejection heads, a X direction guide shaft 2 that supports the carriage 1 such that the carriage 1 is able to move freely in an X direction, and an X direction drive motor 3 that rotates the X direction guide shaft 2. The droplet ejection apparatus 20 is also provided with a mounting stage 4 on which the substrate 11 is placed, a Y direction guide shaft 5 that supports the mounting stage 4 such that the mounting stage 4 is able to move freely in a Y direction, and a Y direction drive motor 6 that rotates the Y direction guide shaft 5. The X direction guide shaft 2 and the Y direction guide shaft 5 are each fixed to predetermined positions of a base 7, and a control unit 8 is placed underneath the base 7. Furthermore, a cleaning mechanism portion 14 and a heater 15 are also provided.

The carriage 1 is provided with a plurality of ejection heads (i.e., is a ejection head) that are able to supply a liquid material such as a dispersion solution that contains fine conductive particles to a substrate at predetermined spacings by ejecting it from nozzles (i.e., ejection apertures). The liquid material can be ejected from each of the plurality of ejection heads individually in accordance with ejection voltages that are supplied from the control unit 8.

The carriage 1 is fixed to the X direction guide shaft 2, and the X direction drive motor 3 is connected to the X direction guide shaft 2. The X direction drive motor 3 is a stepping motor or the like and rotates the X direction drive shaft 2 when drive pulse signals in the X axial direction are supplied thereto from the control unit 8. The carriage 1 moves in the X axial direction along the base 7 in conjunction with a rotation action of the X direction guide shaft 2.

Figure 2A:
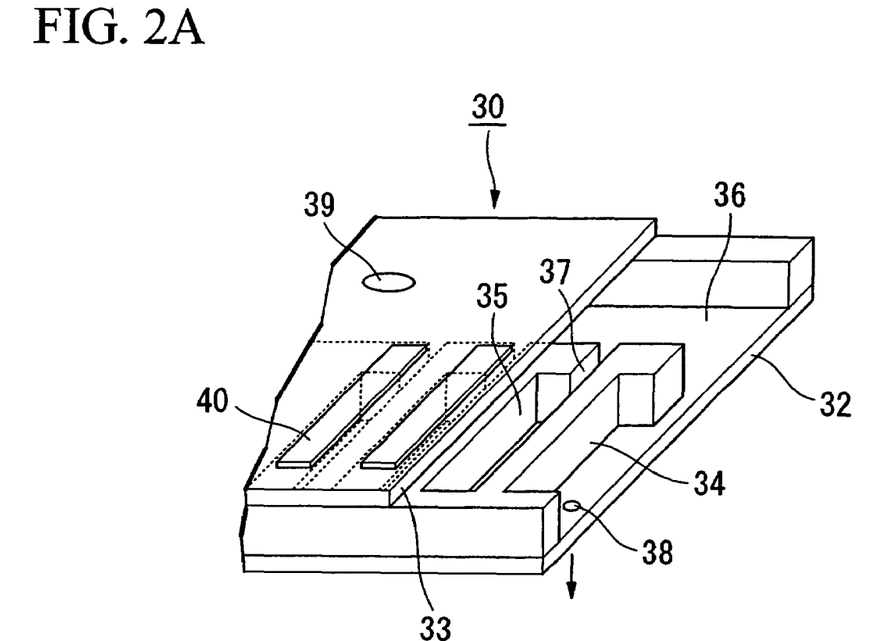
Figure 2B:
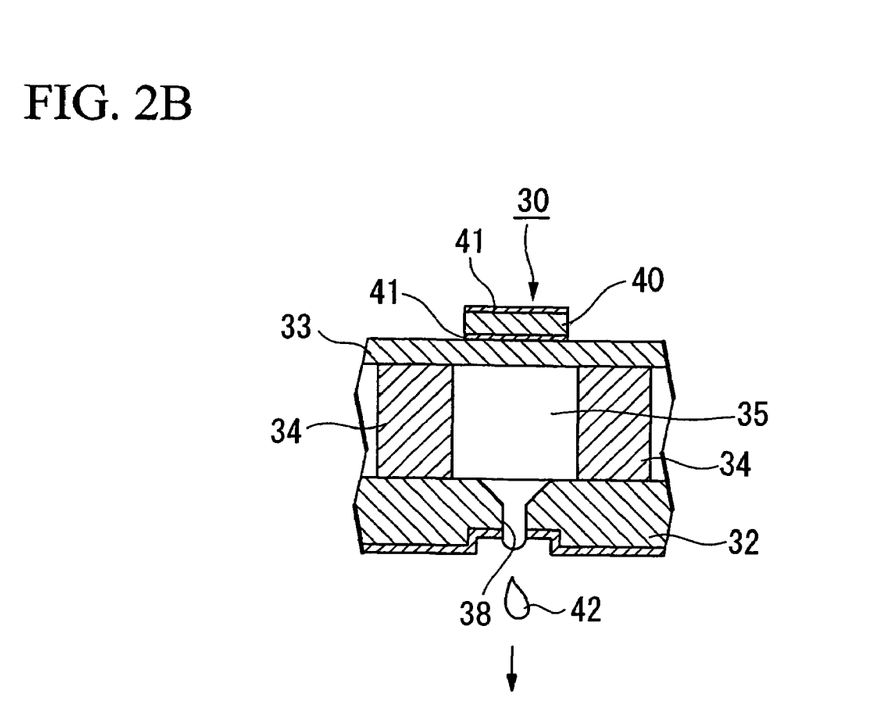
FIG. 2B is a side cross-sectional view showing the structure of a ejection head.

Here, the ejection head that is fitted on the carriage 1 will be described in detail. FIGS. 2A and 2B are views showing a ejection head 30. FIG. 2A is a perspective view showing a breakdown of principal portions of the structure of the ejection head 30. FIG. 2B is a cross-sectional view showing a part of the structure of the ejection head 30.

As shown in FIG. 2A, the ejection head 30 is provided with a diaphragm 33 and a nozzle plate 32 made, for example, from stainless steel. These two are joined together via a partitioning member (i.e., a reservoir plate) 34. A plurality of cavities 35 and a reservoir 36 are formed by the partitioning member 34 between the nozzle plate 32 and the diaphragm 33. The interiors of each cavity 35 and the reservoir 36 are filled with a liquid material, and each cavity 35 communicates with the reservoir 36 via a supply portion 37. Moreover, nozzle holes 38 that are used to eject jets of the liquid material from the cavities 35 to the outside are arranged vertically and horizontally in the nozzle plate 32. An intake hole 39 that is used to supply the liquid material to the reservoir 36 is formed in the diaphragm 33.

As shown in FIG. 2B, piezoelectric elements 40 are joined onto a top of a surface of the diaphragm 33 that is on the opposite side to the surface thereof that faces the cavities 35. The piezoelectric elements 40 are sandwiched between a pair of electrodes 41, and the piezoelectric elements 40 are able to be elastically deformed so as to protrude outwards (i.e., in an upward direction in the drawing) when the electrodes 41 and 41 are energized. As a result of this type of structure being employed, the diaphragm 33 that is joined to the piezoelectric elements 40 is made to flex outwards integrally with the piezoelectric elements 40 by the deformation of the piezoelectric elements 40, and the volume inside the cavities 35 increases in conjunction with this deformation. Accordingly, liquid material equivalent to the amount of the increase in the volume inside the cavities 35 flows from the reservoir 36 via the supply ports 37 into the cavities 35. When the energizing of the piezoelectric elements 40 is ended, the liquid material inside the cavities 35 is pushed towards the nozzle holes 38 by the pressure that is generated when the piezoelectric elements 40 and the diaphragm 33 are restored to their original shape. As a result, droplets 42 of the liquid material are ejected from the nozzle holes 38 towards a substrate.

Figure 3:
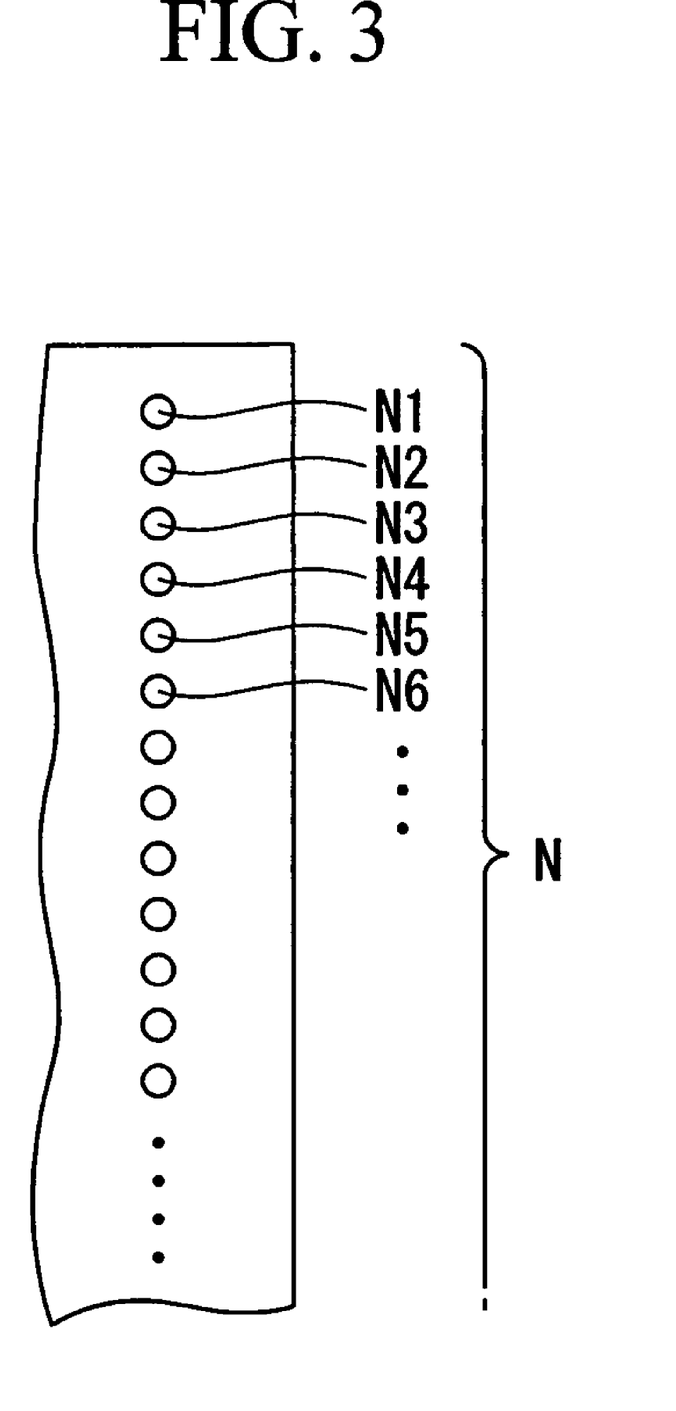
FIG. 3 is a plan view showing the structure of a ejection head.

Note that the shape of a bottom surface of the ejection head 30 that has the structure described above is substantially rectangular, and, as shown in FIG. 3, is positioned in a rectangular configuration when nozzles N (i.e., the nozzle holes 38) are arranged substantially equidistantly in a vertical direction. In this example, a piezoelectric element 40 is provided independently for each one of these nozzles N (i.e., N1, N2, . . . ), and a ejection operation by each nozzle can be controlled independently for each one by control signals that are sent to each piezoelectric element 40. Namely, by controlling the ejection waveform that is sent to these piezoelectric elements 40 in the form of electrical signals, the quantity of liquid material that is ejected from each nozzle N can be adjusted and changed. Here, this control of the ejection waveform can be performed by the control unit 8, so that the control unit 8 also functions as a ejection quantity adjusting device that changes the quantity of liquid material that is ejected from each of the nozzles N.

Note that the type of ejection head 30 is not limited to a piezo jet type that uses the piezoelectric elements 40 and it is also possible to employ, for example, a thermal type of ejection head. In this case, the amount of liquid material that is ejected can be changed using a device such as changing the length of heating time.

Returning to FIG. 1, the mounting stage 4 is used to mount and fix in position a substrate 11 that is provided for a droplet ejection process that uses this droplet ejection apparatus 20, and has a function of fixing the substrate 11 that is placed thereon in a predetermined position.

The mounting stage 4 is supported by the Y direction guide shaft 5. Y direction drive motors 6 and 16 are connected to the Y direction guide shaft 5. The Y direction drive motors 6 and 16 are stepping motors or the like and rotate the Y direction drive shaft 5 when drive pulse signals in the Y axial direction are supplied thereto from the control unit 8. The mounting stage 4 moves in the Y axial direction along the base 7 in conjunction with a rotation of the Y direction guide shaft 5.

The cleaning mechanism 14 has a function of cleaning the ejection head 30 of the carriage 1. The cleaning mechanism 14 is moved along the Y direction guide shaft 5 by the Y direction drive motor 16. The movement of the cleaning mechanism 14 is also controlled by the control unit 8.

The heater 15 is a device for performing a heating treatment on the substrate 11 by lamp annealing, and performs heat treatment by evaporating and drying the liquid ejected onto the substrate and converting it into a conductive film. The turning on and off of the power supply of this heater 15 is also controlled by the control unit 8.

In the droplet ejection apparatus 20 of the present embodiment, in order to eject a dispersion solution onto a predetermined wiring formation area, predetermined drive pulse signals are supplied from the control unit 8 to the X direction drive motor 3 and the Y direction drive motor 6 so that the carriage 1 and/or the mounting stage 4 are moved. As a result, the carriage 1 and the substrate 11 (i.e., the mounting stage 4) are moved relatively to each other. In addition, during this relative movement, a ejection voltage is supplied from the control unit 8 to predetermined ejection heads 30 of the carriage 1 so that the dispersion solution is ejected from the relevant ejection heads 30.

In the droplet ejection apparatus 20 of the present embodiment, the quantity of droplets that are ejected from each ejection head 30 of the carriage 1 is adjusted by the size of the ejection voltage that is supplied from the control unit 8. Moreover, the pitch at which the droplets are ejected onto the substrate 11 is determined by the speed of the relative movement between the carriage 1 and the substrate 11 (i.e., the mounting stage 4), and by the ejection frequency (i.e., the frequency of the supply of the ejection voltage) of the ejection head 30.

(Wiring Substrate Manufacturing Method)

Next, a detailed description will be given of the method of manufacturing a wiring substrate according to the present invention with reference made to FIGS. 4 and 5 and to Table 1. FIGS. 4 and 5 are cross-sectional process views for describing the method of manufacturing a wiring substrate according to the present embodiment. In FIG. 5 the manufacturing process is shown continuing on from FIG. 4. Table 1 is a process table of the method of manufacturing a wiring substrate of the present embodiment. Each process will be described below in order of the step number that is shown in the left hand column of Table 1.

Figure 5A:
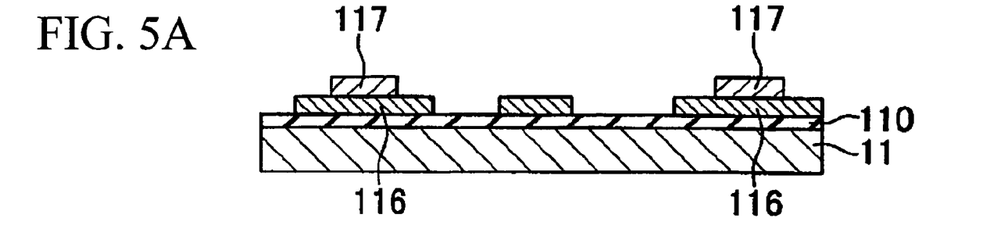
FIG. 5A to 5E are cross-sectional process views of a method of manufacturing a wiring substrate according to an embodiment of the present invention.
Figure 5B:
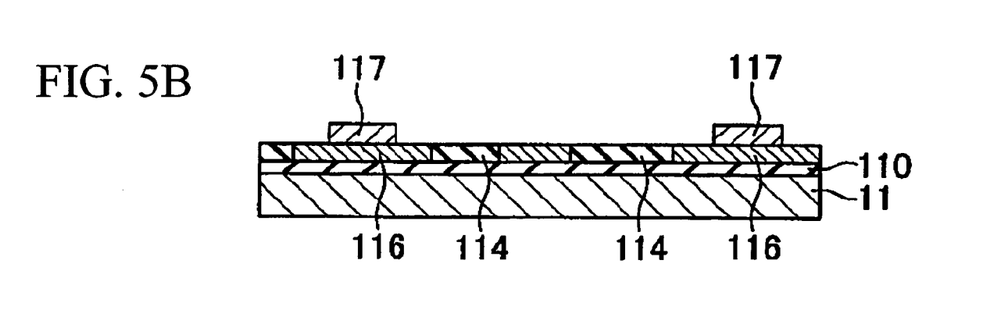
Figure 5C:
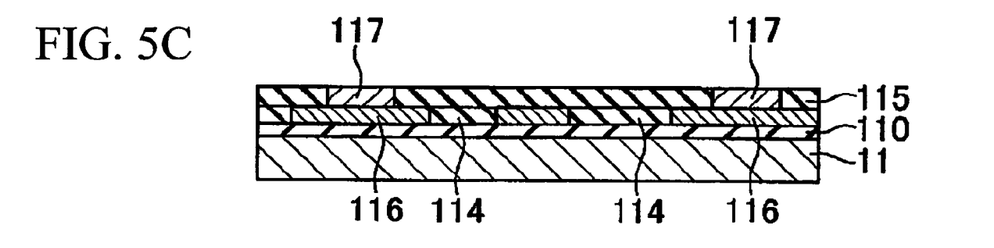
Figure 5D:
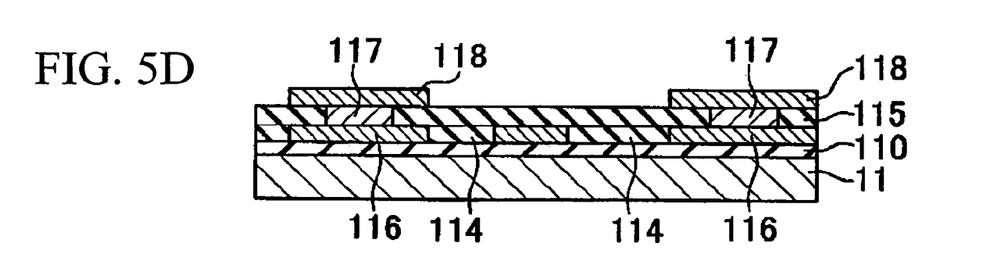
Figure 5E:
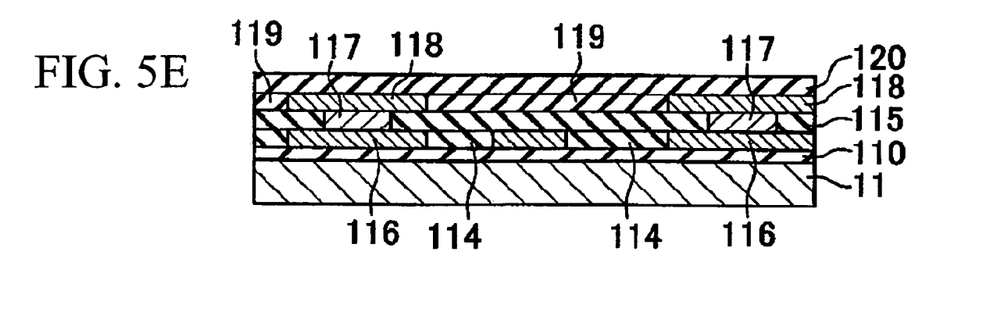

As shown in FIG. 5E, the present embodiment is a method of manufacturing a wiring substrate that is provided with a multilayer wiring structure in which a plurality of layers of wiring patterns 116 and 118 are stacked via a base insulating film 110 on a film substrate 11. Moreover, as is described below, the method of manufacturing a wiring substrate of the present embodiment has a base formation step, a first surface processing step, a wiring formation step, a conductive post formation step, a second surface processing step, an insulating film formation step, and an interlayer insulating film formation step.

TABLE 1

| Step No. | Step | Apparatus | Conditions |
|---|---|---|---|
| 1 | Wash substrate | Excimer UV (172 nm wavelength) | 300 sec |
| 2 | Render frame-shaped insulating film | Droplet ejection apparatus | |
| 3 | UV curing of frame-shaped insulating film | UV (365 nm wavelength) | 4 sec |
| 4 | Render base insulating film | Droplet ejection apparatus | |
| 5 | UV curing | UV (365 nm wavelength) | 60 sec |
| 6 | Control Ag contact angle in first layer | Excimer UV (172 nm wavelength) | 15 sec |
| 7 | Render Ag wiring of first layer | Droplet ejection apparatus | |
| 8 | Temporary Ag drying | Dry air | |
| 9 | Render Ag post of first layer | Droplet ejection apparatus | |
| 10 | Temporary Ag drying | Dry air | |
| 11 | Repeat S9 and S10 | | |
| 12 | Main Ag baking | Hot plate | 150° C. × 30 min |
| 13 | Control contact angle in first insulating film layer | Excimer UV (172 nm wavelength) | 60 sec |
| 14 | Render around Ag of first insulating film layer | Droplet ejection apparatus | |
| 15 | liquid affinity imparting process | Excimer UV (172 nm wavelength) | 10 sec |
| 16 | UV curing | UV (365 nm wavelength) | 4 sec |
| 17 | First insulating film layer | Droplet ejection apparatus | |

TABLE 1-continued

| Step No. | Step | Apparatus | Conditions |
|---|---|---|---|
| 18 | UV curing | UV (365 nm wavelength) | 60 sec |
| | Repeat S6 to S18 for second and subsequent layers | | |

(Base Formation Step)

Figure 4A:
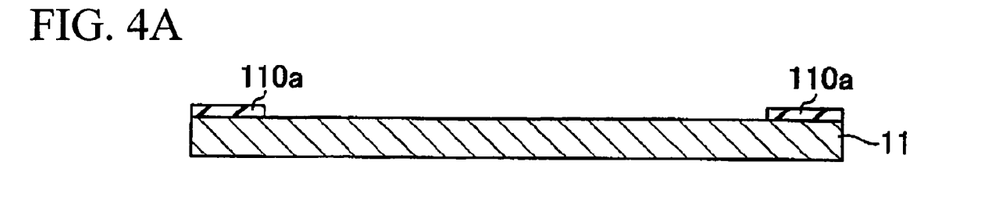
FIG. 4A to 4F are cross-sectional process views of a method of manufacturing a wiring substrate according to an embodiment of the present invention.

Firstly, the surface (i.e., the film formation surface) of the film substrate 11 shown in FIG. 4A is washed (step 1). Specifically, excimer UV having a wavelength of 172 nm is irradiated for approximately 300 seconds onto the surface of the film substrate 11. Note that it is also possible to wash the film substrate 11 using a washing solution such as water, and ultrasonic noise can also be used in combination with the washing solution at this time.

Next, prior to forming the base insulating film 110 on the surface of the film substrate 11, a frame-shaped insulating film 110a is formed by rendering in order for positional control of the base insulating film 110 to be performed (step 2). This rendering is accomplished using a droplet ejection process (i.e., an inkjet process). Namely, using the aforementioned droplet ejection apparatus 20, a resin material (i.e., a first liquid material) that has not yet been cured, which is the material used to form the base insulating film 110, is ejected from the nozzles N of the ejection head 30, and is coated in a frame shape around a peripheral edge portion of a base insulating film 110 formation area. Next, the resin material that has been coated onto the film substrate 11 is cured (step 3). Specifically, UV having a wavelength of 365 nm is irradiated for approximately 4 seconds so as to cure the UV curable resin that is the material used to form the frame-shaped insulating film. As a result, the frame-shaped insulating film 110a is formed that surrounds an area on the film substrate 11 where the base insulating film 110 is formed.

Figure 4B:
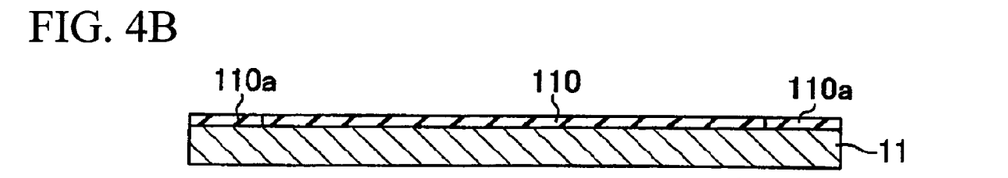

Next, as shown in FIG. 4B, the base insulating film 110 is formed by rendering on an inner side of the frame-shaped insulating film 110a that is formed on the film substrate 11 (step 4). This rendering is also accomplished using a droplet ejection process. Specifically, a pre-cured resin material (i.e., a first liquid material), which is the material for forming the base insulating film 110, is ejected from the nozzles N of the ejection head 30 of the droplet ejection apparatus 20 as the ejection head 30 is made to scan the entire inner side of the area that is surrounded by the frame-shaped insulating film 110a. Here, even if the ejected resin material flows onto the film substrate 11, because it is blocked by the frame-shaped insulating film 100a that is provided at peripheral edge portions, it does not spread beyond the base insulating film 110 formation area.

Next, the ejected resin material is cured (step 5). Specifically, UV having a wavelength of 365 nm is irradiated for approximately 60 seconds so that the UV curable-type resin that is the material for forming the base insulating film 110 is cured. As a result, as shown in FIG. 4B, the base insulating film 110 is formed on the surface of the film substrate 11.

(First Surface Processing Step)

Next, prior to the formation of a wiring pattern on the surface of the base insulating film 110, the contact angle of the surface of the base insulating film 110 is adjusted (step 6). Namely, surface processing is performed on the surface of the base insulating film 110, which is the wiring pattern formation area, to place it in a state that is conducive to forming a wiring pattern.

When ejecting the droplets containing material for forming the wiring pattern, if the contact angle of the surface of the base insulating film 110 is too great, the ejection droplets form balls and are repelled. Consequently, it becomes difficult to form electrical wiring in a predetermined pattern in a predetermined position. If, however, the contact angle of the surface of the base insulating film 110 is too small, the ejection droplets spread out and it becomes difficult to form a finely detailed wiring pattern.

Specifically, the surface processing method is one in which, because the surface of the cured base insulating film 110 exhibits liquid repellency, this liquid repellency of the surface of the base insulating film 110 is lessened by irradiating excimer UV having a wavelength of approximately 172 nm onto this surface for approximately 15 seconds. Accordingly, the contact angle is adjusted so as to be in a state of affinity with the liquid material used to form the wiring pattern that is ejected in a later step onto the base insulating film 110.

This surface processing can be adjusted by changing the length of time of the ultraviolet light irradiation, however, it can also be adjusted using a combination of the intensity and wavelength of the ultraviolet and heat processing (i.e., heating) and the like. Note that other methods of performing the surface processing include plasma processing employing oxygen as the reaction gas, and processing to expose the substrate to an ozone atmosphere.

(Wiring Formation Step)

Figure 4C:
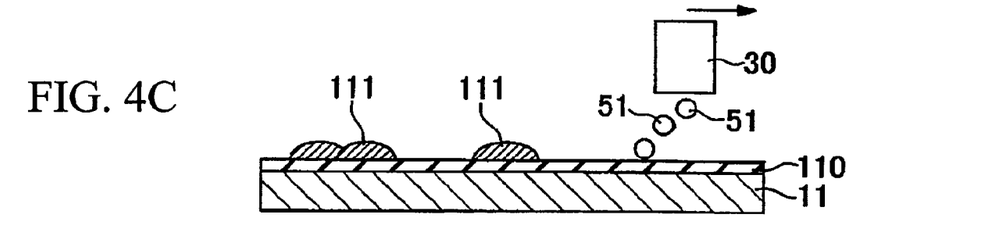

Next, as shown in FIG. 4C, a liquid body pattern 111 that forms a wiring pattern is formed by rendering on the surface of the base insulating film 110 (step 7). Note that, in the cross-sectional processing drawings of FIG. 4C and thereafter, the frame-shaped insulating film 10a that surrounds the base insulating film 110 is omitted from the drawings.

The rendering of the liquid body pattern 111 is accomplished by a droplet ejection process using the droplet ejection apparatus 20. Here, what is ejected is a dispersion solution (i.e., a second liquid material) obtained by dispersing fine conductive particles, which provide the material for forming the wiring, in a dispersion medium. Silver can be favorably used for the fine conductive particles. In addition to silver, fine metal particles containing gold, copper, palladium, or nickel as well as fine particles of a superconductor or a conductive polymer can be used.

The fine conductive particles can also be used after the surfaces thereof have been coated with an organic material in order to improve their dispersibility. Examples of the coating material that can be coated on the surface of the fine conductive particles include polymers that induce steric hindrance or electrostatic repulsion or the like. It is also preferable that the particle diameter of the fine conductive particles is 5 nm or more and 0.1 μm or less. If the particle diameter is greater than 0.1 μm, then blockages can easily occur in the nozzles, and ejecting by the ejection head 30 becomes difficult. If the particle diameter is less than 5 nm, the volume ratio of the coating material relative to the fine conductive particles is too large, and the proportion of the organic material in the final obtained film is too large.

The dispersion medium that is used is one that can disperse the above described fine conductive particles and is not particularly restricted provided that it does not induce flocculation. In addition to water, various alcohols such as methanol, ethanol, propanol, and butanol; hydrocarbon based compounds such as n-heptane, n-octane, decane, toluene, xylene, cymene, dulene, indene, dipentene, tetrahydronaphthalene, decahydronaphthalene, and cyclohexylbenzene; ether based compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1, 2-dimethoxyethane, bis(2-methoxyethyl)ether, and p-dioxane; and polar compounds such as propylene carbonate, γ-butyrolactone, N-methyl-2-pyrrodine, dimethyl formamide, dimethyl sulfoxide, and cyclohexanone. Among these, in view of their ability to disperse fine particles and in view of the stability of the dispersion solution, and also in view of their ease of use in a droplet ejection process, water, alcohols, hydrocarbon based compounds, and ether based compounds are preferable. Particularly preferable dispersion mediums are water and hydrocarbon based compounds. These dispersion mediums can be used singly or in combinations of two or more.

It is preferable that the dispersion medium for the liquid body containing fine conductive particles has a vapor pressure at room temperature of 0.001 mmHg or more and 200 mmHg or less (i.e., approximately 0.133 Pa or more and 26600 Pa or less). If the vapor pressure is higher than 200 mmHg, the dispersion medium after ejection evaporates too quickly, and it becomes difficult to form an excellent film.

It is more preferable that the vapor pressure of the dispersion medium is 0.001 mmHg or more and 50 mmHg or less (i.e., approximately 0.133 Pa or more and 6650 Pa or less). If the vapor pressure is higher than 50 mmHg, then nozzle blockages easily occur that are caused by drying when droplets are ejected using a droplet ejection process, and a stable ejection becomes difficult. However, if the dispersion medium has a vapor pressure at room temperature that is lower than 0.001 mmHg, then drying is slowed, and the dispersion medium tends to remain in the film. As a result, it is difficult to obtain an excellent conductive film after the subsequent steps of heat processing and/or light processing.

The dispersoid concentration when fine conductive particles are dispersed in a dispersion medium is 1% by mass or more and 80% by mass or less and can be adjusted in accordance with the desired film thickness of the conductive film. If the dispersoid concentration exceeds 80% by mass or less, then flocculation can easily occur and a uniform film is difficult to obtain.

The surface tension of the fine conductive particle dispersion solution preferably falls within a range of 0.02 N/m or more and 0.07 N/m or less. When a liquid body is ejected using a droplet ejection process, if the surface tension is less than 0.02 N/m, then the wettability of the liquid material supplied for ejection relative to the nozzle surface increases which leads to increased off-target ejections. If the surface tension exceeds 0.07 N/m, then the shape of the meniscus at the nozzle tips is unstable which leads to control of the ejection quantity and ejection timing becoming difficult.

In order to adjust the surface tension, minute quantities of a fluorine based, silicon based, or nonion based surface tension modifier or the like can be added to the above dispersion solution within a range whereby the contact angle relative to the base insulating film 110 is not excessively lowered. Nonion based surface tension modifiers improve the wettability towards the base insulating film 110, improve the leveling property of the film, and are useful in preventing the generation of projections on the coated film surface and the generation of peeling and the like. It is also possible for the dispersion solution to include where necessary organic compounds such as an alcohol, ether, ester, ketone, and the like.

The viscosity of the dispersion solution is preferably 1 mPa·s or more and 50 mPa·s or less.

When a ejection is made using a droplet ejection process, if the viscosity is less than 1 mPa·s, peripheral portions of the nozzles are easily contaminated by the ink outflow. If, however, the viscosity is greater than 50 mPa·s, then the frequency of blockages of the nozzle holes increases and a smooth droplet ejection becomes difficult.

In the present embodiment, droplets of the dispersion solution are ejected from the ejection head 30, and are dropped onto positions where the wiring pattern is to be formed. At this time, it is desirable that the extent to which the continuously ejected droplets overlap each other is regulated so that bulges do not occur.

As a result of the above procedure, a liquid body pattern 111 is formed on the surface of the base insulating film 110.

Next, the liquid body pattern 111 is temporarily dried so that temporary dried bodies 112 of a liquid body pattern such as that shown in FIG. 4C are obtained (step 8). This temporary drying is performed to the extent that at least the surface of the liquid body pattern 111 is dried. Specifically, dry air such as low humidity air or inert gas is blown onto the liquid body pattern 111. The temperature of the dry air may be room temperature (i.e., approximately 25° C.) or may be a higher temperature. Moreover, instead of blowing dry air, it is also possible to irradiate infrared rays onto the liquid body pattern 111 using the heater 15 that is composed of an infrared lamp or the like that is provided in the aforementioned droplet ejection apparatus 20. In this manner, by employing the blowing of dry air or the irradiation of infrared light as the specific method of the temporary drying, the temporary drying can be accomplished using simple manufacturing equipment and a simple manufacturing procedure. As a result, it is possible to suppress any rise in equipment costs and manufacturing costs. Moreover, even if the temperature does rise for a short time due to the temporary drying, because the temperature can be immediately restored to room temperature, the manufacturing time can be shortened.

(Conductive Post Formation Step)

Figure 4D:
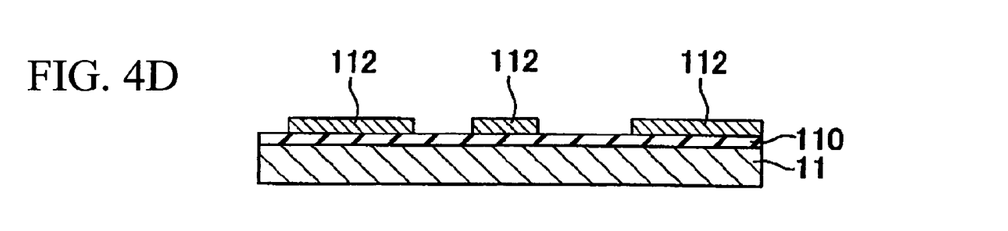
Figure 4E:
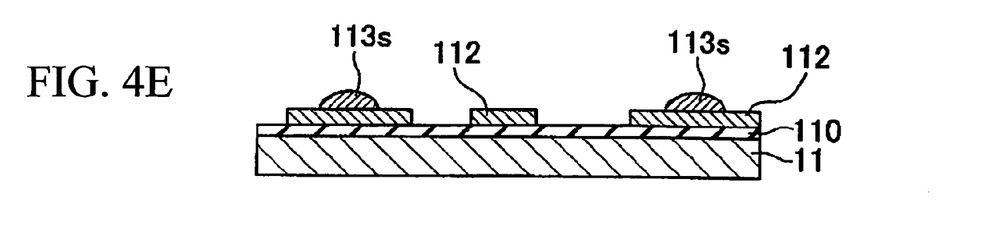

Next, as shown in FIG. 4D, liquid sub-posts 113 that will subsequently become conductive posts are formed by rendering on a portion of the temporary dried bodies 112 (step 9). In the same way as the rendering of the liquid body pattern 111 in step 7, this rendering is also performed using a droplet ejection process that employs the droplet ejection apparatus 20. What is ejected here is a dispersion solution obtained by dispersing fine conductive particles of the material for forming the conductive posts in a dispersion medium. Specifically, the same material is used as the liquid material used to render the liquid body pattern 111.

Namely, after the liquid body pattern 111 has been rendered, the liquid material can then be ejected using the same droplet ejection head onto the conductive post formation positions.

The conductive posts are used to make an electrical connection between wiring layers via an interlayer insulating film, and they must be formed at the proper height. In order to achieve this, it is necessary to eject a large number of droplets onto the same positions using a droplet ejection process so that liquid posts are formed at an equal height. However, if a large number of droplets are ejected at one time, it is difficult to secure the height required in the liquid posts and, conversely, the liquid posts tend to spread over the film substrate 11, thereby giving rise to the possibility that short-circuiting will occur with adjacent wiring and conductive posts. Therefore, the droplet ejection is divided into a number of ejections.

In one of these droplet ejections, a liquid sub-post that is lower than the height required in the liquid post is formed. For example, in one ejection approximately 10 droplets are ejected so as to first form the liquid sub-posts 113s that make up the first layer.

Next, the liquid sub-posts 113s are temporarily dried (step 10). This temporary drying is performed such that at least the surfaces of the liquid sub-posts 113s are dried. Specifically, in the same way as in the method used to temporarily dry the liquid body pattern 111 in step 8, it is desirable that the blowing of dry air or the irradiation of infrared rays is employed.

Figure 4F:
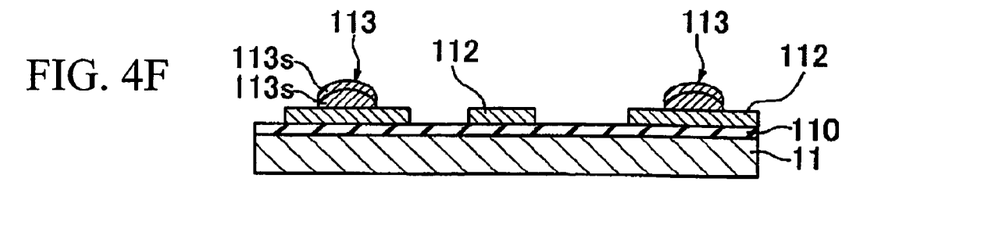

Next, step 9 and step 10 are repeated (step 11). Because the liquid sub-posts 113s forming the first layer are temporarily dried, as is described above, when new droplets are ejected onto the surface thereof they do not spread over the surface of the base insulating film 110. Therefore, if approximately 10 new droplets are ejected, as shown in FIG. 4F, it is possible to stack a second liquid sub-post 113s layer on top of the first liquid sub-post 113s layer. In this manner, by repeatedly performing steps 9 and 10, a plurality of liquid sub-post 113s layers (two layers in the drawings) can be stacked on the film substrate 11, and liquid posts 113 having the proper height can be obtained.

Next, the main baking of the temporary dried bodies 112 of the liquid body pattern and of the liquid posts 113 is performed (step 12). Because the temporary dried bodies 112 and the liquid posts 113 are all in a temporarily dried state as a result of the respective steps described above, they can all be baked in a single operation. Specifically, the film substrate 11 on which the temporary dried bodies 112 and the liquid posts 113 have been formed are heated for approximately 30 minutes on a hot plate heated to 150° C.

This main baking is conducted in a normal atmosphere, however, if necessary, it can also be conducted in an inert gas atmosphere such as a nitrogen, argon, or helium atmosphere or the like. Note that the processing temperature in the main baking is set to 150° C., however, it is desirable that this processing temperature is appropriately set in consideration of the boiling point (i.e., the evaporation point) of the dispersion medium contained in the temporary dried bodies 112 and the liquid posts 113, the type and pressure of the atmospheric gas, the thermal behavior such as the dispersibility and the oxidizability of the fine grains, the existence or otherwise as well as the quantity of the coating material, the temperature to which the base material is heat resistant, and the like.

This type of baking processing can be performed using a normal hot plate, electric furnace or the like and can also be performed by lamp annealing. The light source for light used in the lamp annealing is not particularly restricted and infrared lamps, xenon lamps, YAG lasers, argon lasers, carbon dioxide gas lasers, and excimer lasers such as XeF, XeCl, XeBr, KrF, KrCl, ArF, and ArCl lasers can be used as the light source. Generally, the light sources that are used here have an output in the range of 10 W or more to 5000 W or less, however, in the present embodiment, a range of 100 W or more to 1000 W or less is sufficient.

As a result of this main baking, the dispersion medium contained in the temporary dried bodies 112 and the liquid posts 113 are volatile and electrical contact between the fine metal particles is ensured. As a result, as shown in FIG. 5A, the wiring pattern 116 and conductive posts 117 are formed on the base insulating film 110.

(Second Surface Processing Step)

Next, prior to forming an in-layer insulating film 114 (see FIG. 5B) on the wiring pattern 116 formation layer, the contact angle of the surface of the base insulating film 110 is adjusted (step 13). As is described above, although the surface of the cured base insulating film 110 had exhibited liquid repellency and has been made liquid repellency to a certain extent in the earlier first surface processing step, the surface characteristics that are favorable for forming a wiring pattern are different from the surface characteristics that are favorable for forming an interlayer insulating film. Specifically, it is preferable that the liquid material that is used to form the in-layer insulating film 114 flow extremely easily over the base insulating film 110. Therefore, in order to impart even greater liquid affinity to the base insulating film 110 with the aim of increasing the affinity between this liquid material and the surface of the base insulating film 110, the base insulating film 110 is irradiated using excimer UV having a wavelength of 172 nm for approximately 60 seconds.

(Insulating Film Formation Step)

Next, as shown in FIG. 5B, the in-layer insulating film 114 is rendered around the wiring pattern 116 (step 14). The formation of the in-layer insulating film 114, which is an insulating film formation step according to the present invention, is also accomplished using a droplet ejection apparatus in the same way as in the rendering of the base insulating film 110. Here, if a liquid resin material, which is the material used to form the in-layer insulating film, is ejected so as to be in contact with the conductive posts 117, there is a possibility that the resin material will spread to the top end of the conductive posts 117 and conduction malfunctions will occur in connection portions with the wiring pattern of the layer above. Therefore, a gap is provided around the conductive posts 117 and the wiring pattern 116 and the resin is ejected on the outside of this gap.

Next, excimer UV having a wavelength of 172 nm is irradiated onto the gap around the conductive posts 117 and the wiring pattern 116 so as to perform liquid affinity imparting process (step 15). Consequently, as a result of the gap around the conductive posts 117 and the wiring pattern 116 being furnished with liquid affinity, the resin material flows into this gap and makes contact with the wiring pattern 116. In this case, it is possible that the resin material will partially spread onto the surface of the wiring pattern 116, however, the resin material does not reach the top of the conductive posts that protrude above the wiring pattern 116. Accordingly, it is possible to secure conductivity between the conductive posts 117 and the wiring pattern of the layer above this layer that is formed in a subsequent process.

Next, the ejected resin material is cured (step 16). Specifically, UV having a wavelength of 365 v nm is irradiated for approximately 4 seconds so as to cure the UV curable resin, which is the material used to form the in-layer insulating film. As a result, the in-layer insulating film is formed.

(Interlayer Insulating Film Formation Step)

Next, as shown in FIG. 5C, an interlayer insulating film 115 that covers the wiring pattern 116 and the in-layer insulating film 114 is rendered (step 17). In the same way as the rendering of the base insulating film 10m this rendering is also performed using a droplet ejection apparatus. It is also desirable here that the resin material is ejected with a gap being provided around the conductive posts 117.

Next, the ejected resin material is cured (step 18). Specifically, UV having a wavelength of 365 nm is irradiated for approximately 60 seconds so as to cure the UV curable-type resin, which is the material used to form the interlayer insulating film. As a result, the interlayer insulating film 115 is formed.

Next, as shown in FIG. 5D, a wiring pattern 118 forming the next layer up is formed on the surface of the interlayer insulating film 115. Specifically, the same method is used to form this layer as in the series of steps from step 6 to step 8 that were used to form the wiring pattern 116 of the layer underneath.

Next, as shown in FIG. 5E, an in-layer insulating film 119 is formed in the layer in which the wiring pattern 118 is formed that is located on the top side. Specifically, the same method is employed as in the series of steps from step 14 to step 16 for creating the in-layer insulating film in the layer in which the wiring pattern 116 is formed. Furthermore, by performing step 17 and step 18, as shown in FIG. 5E, it is possible to form an interlayer insulating film 120 on the surface of the top side wiring pattern 118.

In this manner, by repeating the series of steps from step 6 to step 18, a wiring pattern can be stacked on the film substrate 11. Note that it is also possible to form a protective film on the surface of the electrical wiring on the topmost layer using the same process as in steps 17 and 18.

By performing the above described procedure, a wiring substrate having a multilayer wiring structure can be manufactured.

As is described above, in the method of manufacturing a wiring substrate of the present embodiment, a first processing step (i.e., step 6) is performed prior to the step to render the liquid wiring pattern 111 using a droplet ejection process (i.e., step 7), and a second surface processing step (i.e., step 13) is performed prior to the insulating film formation step (i.e., step 14) to form the in-layer insulating film 114. In this manner, by increasing the affinity (i.e., the liquid affinity and the contact angle) of the base insulating film 110 towards the liquid material during the formation of the in-layer insulating film 114 so that this affinity is greater than the affinity (i.e., the liquid affinity and the contact angle) of the base insulating film 110 towards the liquid material during the formation of the wiring pattern 116 by a droplet ejection process, it is possible in the formation of the wiring pattern 116 to form a detailed pattern to an accurate width, and it is also possible in the formation of the in-layer wiring pattern 114 to form an insulating film that has a more uniform thickness thanks to the excellent fluidity of the liquid material on the surface of the base insulating film 110.

In the present embodiment, the length of irradiation time that ultraviolet light (i.e., excimer UV) is irradiated onto the base insulating film 110 is changed each time the affinity between the base insulating film 110 and the liquid material is adjusted. Namely, in the first surface processing step, the irradiation time is approximately 15 seconds, however, in the second surface processing step, it is approximately 60 seconds. However, the surface processing conditions in the manufacturing method according to the present invention are not limited to the ultraviolet light irradiation time, and they can also be adjusted by altering the irradiation intensity (i.e., the power) of the ultraviolet light.

In the present embodiment, the affinity between the liquid material and the film formation surfaces is controlled based on contact angles after surface processing, and it is possible to obtain a comparatively accurate degree of affinity extremely simply.

Moreover, after the liquid pattern 111 that has been formed on the film substrate 11 has been temporarily dried, steps (i.e., steps 9 to 11) to render liquid posts on a portion of the temporary dried body 112 are subsequently performed using a droplet ejection process, and a step (i.e., step 12) to perform the main baking of the liquid posts 113 and the temporary dried body 112 that is formed as a liquid pattern is also subsequently performed. Namely, because the liquid posts are rendered on the surface of a liquid pattern that is in a temporarily dried state, the two can be fused together at their boundary faces. In addition, by performing the main baking of the liquid pattern and the liquid posts in a single operation, the wiring pattern and the conductive posts can be formed as a single body. As a result, the occurrence of cracks in boundary faces between the wiring pattern 116 and the conductive posts 117 can be prevented, and it is possible to obtain a wiring substrate that is equipped with a wiring pattern 116 that has extremely reliable conduction connections.

Moreover, in the method of manufacturing a wiring substrate of the present embodiment, because a droplet ejection process is employed in the formation of the wiring patterns, conductive posts, and various insulating films, it becomes possible to improve the material utilization efficiency and to lower manufacturing costs. Furthermore, multiple layers and greater degrees of miniaturization in the wiring patterns become possible. As an example, it becomes possible to achieve a miniaturization in the width of the lines of wiring patterns from a conventional 50 μm to approximately 30 μm, and in the spaces between the lines from a conventional 50 μm to approximately 30 μm. As a result, a further reduction in the size of wiring substrate and a higher degree of integration thereof can be achieved. This contributes to a reduction in the size of an electronic instrument that uses this wiring substrate.

In the present embodiment, a description is given of an example of a method of manufacturing a wiring substrate for a multilayer wiring structure, however, the present invention can also be applied as a method of forming a wiring pattern (i.e., circuit wiring) on a hard substrate. Moreover, in the present embodiment, a description is given of when conductive posts are formed on a wiring pattern, however, cases in which the conductive posts are formed on electrode lands of a wiring pattern are also included within the technical range of the present invention.

Moreover, in the above described embodiment, a description is given of when the wiring pattern 116 and the in-layer insulating film 114 are formed in the same layer on the base insulating film 110, however, depending on the thickness and the like of the wiring pattern 116, the in-layer insulating film 114 can also be formed so as to cover the wiring pattern 116. In this case, because the in-layer insulating film 114 is structured so as to also function as the interlayer insulating film 115, the step to form the interlayer insulating film 115 can be omitted. It is thereby possible to reduce the number of steps and consequently achieve a reduction in costs.

Moreover, in the above described embodiment, the wiring substrate being manufactured is formed as a two layer structure having a lower side wiring pattern 116 and an upper side wiring pattern 118 formed on a substrate 11 and having conductive posts 117 that connect these wiring layers together, however, the present invention is not limited to this and the present invention can also be applied to the manufacture of wiring substrates having a multilayer wiring structure such as a three layer structure or a structure made up of four or more layers. Moreover, a wiring substrate that is obtained by this type of method of manufacturing a wiring substrate is used in a variety of electronic instruments that are provided with, for example, semiconductor elements or the like, however, all of the variety of electronic instruments that are provided with this multilayer wiring structure become the electronic instruments of the present invention.

(Electro-optical Device)

In the above described embodiment a description is given of an example of a wiring substrate that is equipped with a stacked wiring pattern. A description will now be given with reference made to FIG. 6 of a liquid crystal module which is an example of an electro-optical device in which the wiring substrate of the above described embodiment is employed.

Figure 6:
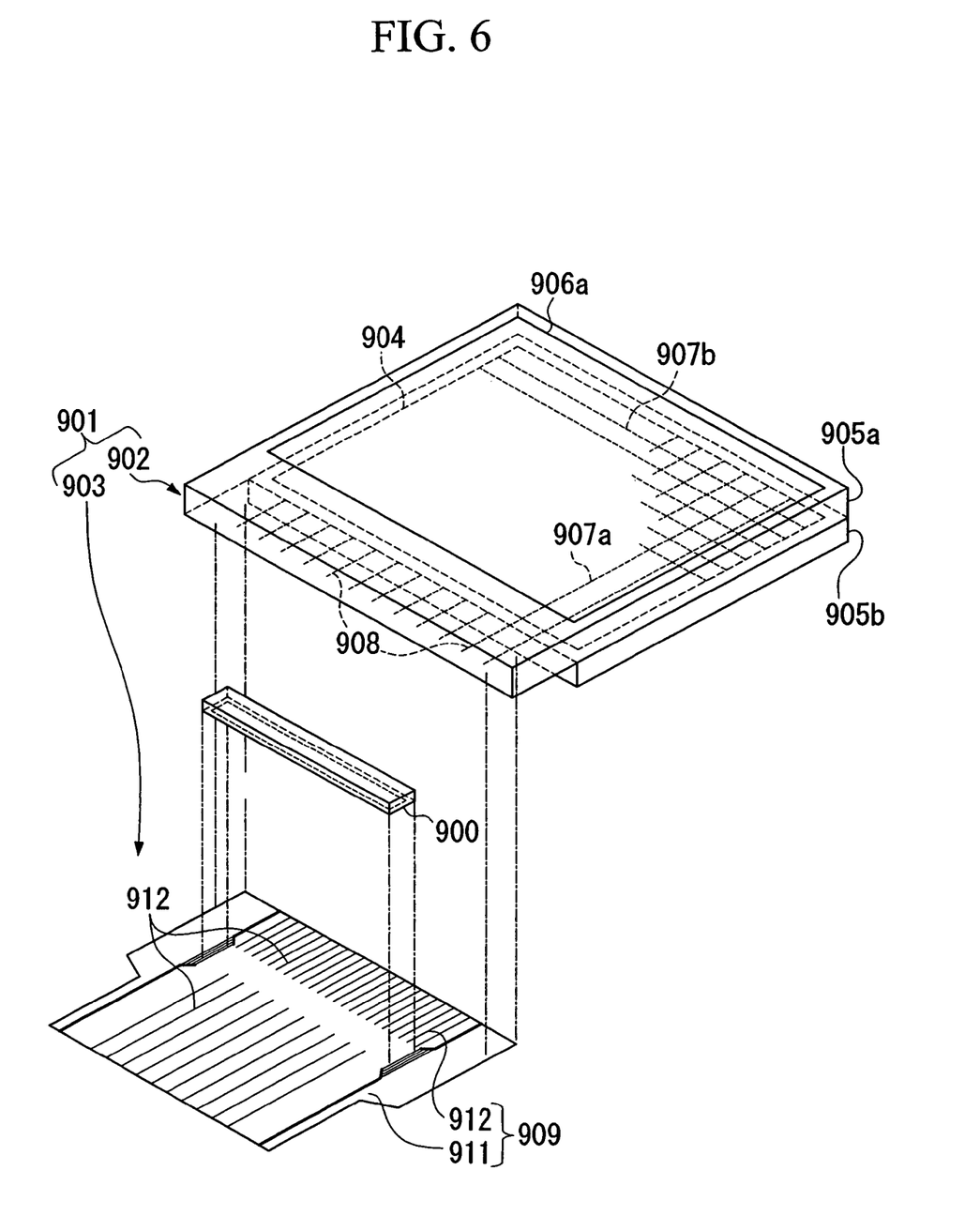
FIG. 6 is a view showing an example of an electro-optical device equipped with the wiring substrate according to an embodiment of the present invention.

FIG. 6 is an exploded perspective view of a liquid crystal module that is equipped with a circuit substrate having a chip-on-film (COF) structure. Broadly speaking, a liquid crystal module 901 is constructed having a liquid crystal panel 902 used for color displays, a circuit substrate 903 that is connected to the liquid crystal panel 902, and a liquid crystal drive IC 900 that is packaged on the circuit substrate 903. Note that, if necessary, illumination devices such as backlights and other peripheral devices may be added to the liquid crystal panel 902.

The liquid crystal panel 902 has a pair of substrates 905a and 905b that are adhered together by a sealing material 904, and a gap that is formed between the substrate 905a and the substrate 905b (what is known as a cell gap) is filled with liquid crystal. Namely, the liquid crystal is sandwiched between the substrate 905a and the substrate 905b. Generally, these substrates 905a and 905b are formed from a transparent material such as glass, synthetic resin, or the like. A polarization plate 906a is adhered to the outer side surface of the substrates 905a and 905b.

Moreover, an electrode 907a is formed on the inner side surface of the substrate 905a and an electrode 907b is formed on an inner side surface of the substrate 905b. These electrodes 907a and 907b are formed from a transparent conductive material such as indium tin oxide (ITO). The substrate 905a is positioned so as to protrude partially in the surface direction beyond the substrate 905b, and has a plurality of terminals 908 that are formed on this protruding portion. These terminals 908 are formed together with the electrode 907a when the electrode 907a is formed on the substrate 905a. Accordingly, the terminals 908 are also formed, for example, from ITO.

These terminals may also be formed by terminals that are formed by extending the electrode 907a to the end portion of the substrates and also terminals that are connected to the electrode 907b via some other conductive material (not shown).

A wiring substrate that is obtained by the manufacturing method of the above described embodiment is used for the circuit substrate 903, and the liquid crystal drive IC 900 is packaged on a predetermined position on a wiring substrate 909. Note that, although omitted from the drawings, it is also possible to package resistors, condensers, and other chip components on areas other than those where the liquid crystal drive IC 900 is packaged. The wiring substrate 909 is obtained by forming wiring patterns 912 that have been formed using silver or the like on a film substrate 911 that has flexibility such as one formed from polyimide.

Moreover, electrode pads (not shown) are formed at end portions of each wiring pattern 912 in the packaging area of the liquid crystal drive IC 900 where the distal end portions of the wiring patterns 912 and 912 that extend from end portions of both short sides of the substrate are located. In addition, a plurality of bump electrodes that are formed on an active surface of the liquid crystal drive IC 900 are electrically connected via an anisotropic conductive film (ACF) to the plurality of electrode pads. This ACF is obtained by dispersing a large number of fine conductive particles in a thermoplastic or thermosetting adhesive resin, and electrically connects the bump electrodes on the packaged liquid crystal drive IC 900 to the electrode pads of the wiring pattern 912 via the fine conductive particles that are interposed between the two.

The circuit substrate 903 on which the liquid crystal drive IC is packaged is connected to the substrate 905a of the liquid crystal panel 902. Specifically, the wiring pattern 912 of the circuit substrate 903 is electrically connected via an ACF (not shown) to the terminals 908 of the substrate 905a. Note that because the circuit substrate 903 has flexibility, it can be freely folded so as to enable a reduction in space to be achieved.

In a liquid crystal module 901 that has the above described structure, signals are input into the liquid crystal drive IC 900 via the wiring pattern 912 that extends to the outer side of the circuit substrate 903. Drive signals that are output from the liquid crystal drive IC 900 are input into the liquid crystal panel 902 via the wiring pattern 912 that extends to the liquid crystal panel side. As a result, the driving of the display of the liquid crystal panel 902 is achieved.

Note that among the electro-optical devices of the present invention are included devices having an electro-optical effect of changing the transmittance of light as a result of the refractive index of a substance being changed by an electrical field, as well as devices that convert electrical energy into optical energy. Namely, the present invention can be broadly applied not only to the above described liquid crystal display device, but also to light generating devices such as organic electroluminescence (EL) devices and inorganic EL devices, plasma display devices, electrophoretic display devices, display devices that use electron emission elements (such as field emission displays and surface-conduction electron-emitter displays), and the like. For example, it is also possible to construct an organic EL module by connecting a circuit substrate that uses the wiring substrate of the above described embodiment to an organic EL panel.

(Electronic Instrument)

Figure 7:
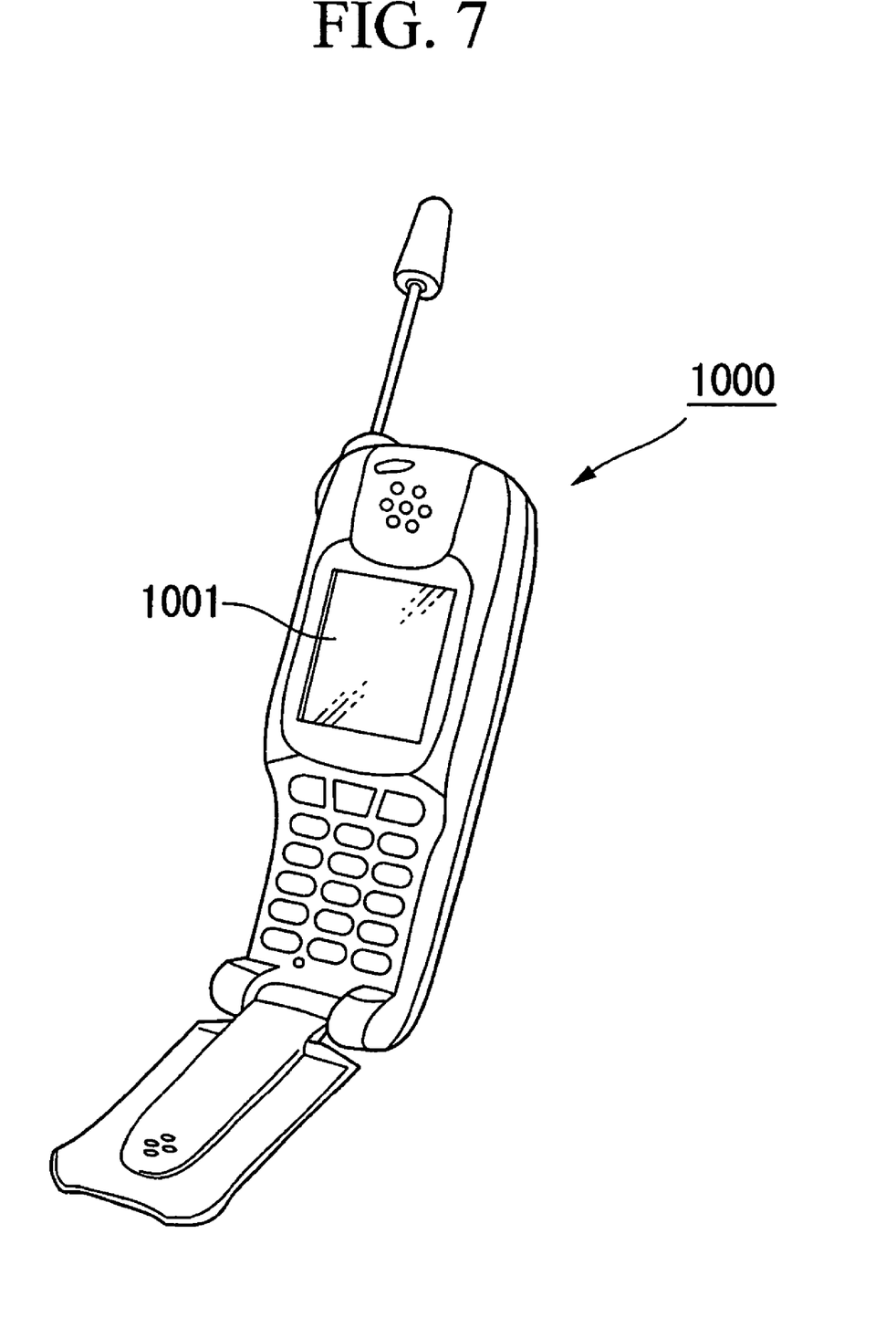
FIG. 7 is a perspective view showing the structure of an example of an electronic instrument.

Next, a description will be given using FIG. 7 of an electronic instrument that is manufactured using the film forming method of the present embodiment. FIG. 7 is a perspective view of a mobile telephone. In FIG. 7, the symbol 1000 indicates a mobile telephone, while the symbol 1001 indicates a display section. An electro-optical device that is provided with the wiring substrate of the above described embodiment is used for the display section 1001 of the mobile telephone 1000. Accordingly, it is possible to provide a small-sized mobile telephone 1000 whose electrical connections are extremely reliable.

The present invention is not limited to mobile telephones and can be favorably used as an image display device for electronic instruments such as electronic books, personal computers, digital still cameras, liquid crystal televisions, viewfinder type or monitor direct view type video tape recorders, car navigation systems, pagers, electronic notebooks, calculators, word processors, work stations, videophones, POS terminals, and touch panels. In every case, it is possible to provide an electronic instrument whose electrical connections are extremely reliable.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A method of manufacturing a wiring substrate having a wiring layer formation step that comprises:

a first surface processing step in which surface processing is performed on a film formation area of a substrate;

a wiring formation step in which a wiring pattern is formed by placing a first liquid material on the film formation area so that a plurality of gaps is formed in the wiring pattern;

a second surface processing step in which surface processing is once again performed on the film formation area; and an insulating film formation step in which an insulating film is formed by placing a second liquid material in the gaps in the wiring pattern, wherein an affinity between the second liquid material and the film formation area in the insulating film formation step is greater than an affinity between the first liquid material and the film formation area in the wiring formation step.

2. The method of manufacturing a wiring substrate according to claim 1, wherein a common surface processing apparatus is used in the first surface processing step and the second surface processing step, and the affinity between the second liquid material and the film formation area in the insulating film formation step is greater than the affinity between the first liquid material and the film formation area in the wiring formation step by making the processing time in the second surface processing step longer than the processing time in the first surface processing step.

3. The method of manufacturing a wiring substrate according to claim 2, wherein the surface processing apparatus is an ultraviolet irradiation apparatus that irradiates ultraviolet light onto the substrate.

4. The method of manufacturing a wiring substrate according to claim 1, wherein a common surface processing apparatus is used in the first surface processing step and the second surface processing step, and the affinity between the second liquid material and the film formation area in the insulating film formation step is greater than the affinity between the first liquid material and the film formation area in the wiring formation step by making the processing speed in the second surface processing step faster than the processing speed in the first surface processing step.

5. The method of manufacturing a wiring substrate according to claim 3, wherein the surface processing apparatus is an ultraviolet irradiation apparatus that irradiates ultraviolet light onto the substrate.

6. The method of manufacturing a wiring substrate according to claim 1, wherein, prior to the first surface processing step, there is provided a base formation step in which a base insulating film is formed on the film formation area of the substrate.

7. The method of manufacturing a wiring substrate according to claim 6, wherein the base formation step includes: a step in which a liquid material that includes a material used to form the base insulating film is coated on the substrate; and a step in which the base insulating film is formed by curing the liquid material that has been coated on the substrate.

8. The method of manufacturing a wiring substrate according to claim 7, wherein the liquid material that is placed on the substrate in the base formation step and the second liquid material that is placed on the substrate in the insulating film formation step in which the insulating film is formed in the gaps in the wiring pattern are the same liquid material.

9. The method of manufacturing a wiring substrate according to claim 1, wherein the wiring pattern is silver wiring.

10. The method of manufacturing a wiring substrate according to claim 1, wherein there is included an interlayer insulating film formation step in which an interlayer insulating film is formed that covers the wiring pattern and the insulating film, and a multilayer wiring structure is formed on the substrate by repeatedly performing the wiring layer formation step and the interlayer insulating film formation step.

11. The method of manufacturing a wiring substrate according to claim 10, wherein the interlayer insulating film formation step is a step in which an interlayer insulating film is formed by placing a third liquid material on the surface area of the substrate including the wiring pattern and the insulating film, and there is provided a third liquid affinity imparting step in which liquid affinity imparting process is performed on the surface area of the substrate including the wiring pattern and the insulating film between the wiring layer formation step and the interlayer insulating film formation step, and an affinity between the surface area and the third liquid material in the interlayer insulating film formation step is equal to affinity between the second liquid material and the film formation area in the insulating film formation step.

12. The method of manufacturing a wiring substrate according to claim 10, wherein the wiring layer formation step includes a conductive post formation step in which conductive posts are formed by ejecting liquid material onto a surface of the wiring pattern.

13. The method of manufacturing a wiring substrate according to claim 12, wherein, in the wiring formation step that includes the conductive post formation step, in the wiring formation step, a temporary dried body is formed by temporarily drying the first liquid material that has been placed on the film formation area, and in the conductive post formation step, after liquid posts have been formed by placing the third liquid material on the temporary dried body, the temporary dried body and the liquid posts are heated so as to form the wiring pattern and the conductive posts.

14. The method of manufacturing a wiring substrate according to claim 1, wherein, in the insulating film formation step, the insulating film is formed so as to cover the wiring pattern, and a multilayer wiring structure is formed on the substrate by repeatedly performing the wiring layer formation step with the surface of the insulating film taken as the film formation area.

15. The method of manufacturing a wiring substrate according to claim 14, wherein the wiring layer formation step includes a conductive post formation step in which conductive posts are formed by ejecting liquid material onto a surface of the wiring pattern.

16. The method of manufacturing a wiring substrate according to claim 15, wherein, in the wiring formation step that includes the conductive post formation step, in the wiring formation step, a temporary dried body is formed by temporarily drying the first liquid material that has been placed on the film formation area, and in the conductive post formation step, after liquid posts have been formed by placing the third liquid material on the temporary dried body, the temporary dried body and the liquid posts are heated so as to form the wiring pattern and the conductive posts.

* * * * *